United States Patent
Ikushima

(10) Patent No.: US 8,176,870 B2
(45) Date of Patent: May 15, 2012

(54) LIQUID MATERIAL APPLICATION DEVICE

(75) Inventor: Kazumasa Ikushima, Mitaka (JP)

(73) Assignee: Musashi Engineering, Inc., Mitaka-shi, Tokyo (JP)

( * ) Notice: Subject to any disclaimer, the term of this patent is extended or adjusted under 35 U.S.C. 154(b) by 658 days.

(21) Appl. No.: 12/092,237

(22) PCT Filed: Oct. 27, 2006

(86) PCT No.: PCT/JP2006/321481
§ 371 (c)(1),
(2), (4) Date: May 27, 2009

(87) PCT Pub. No.: WO2007/052548
PCT Pub. Date: May 10, 2007

(65) Prior Publication Data
US 2009/0266297 A1 Oct. 29, 2009

(30) Foreign Application Priority Data
Oct. 31, 2005 (JP) ................... 2005-315798

(51) Int. Cl.
*B05B 13/02* (2006.01)
*B05B 1/28* (2006.01)
*B05B 3/00* (2006.01)

(52) U.S. Cl. .................... 118/305; 118/323; 118/326

(58) Field of Classification Search .............. 118/300, 118/326, 313–315, 323, 305, 708; 427/427.1, 427/427.3
See application file for complete search history.

(56) References Cited

U.S. PATENT DOCUMENTS
2005/0045096 A1* 3/2005 Kojima ................... 118/323
2005/0122351 A1 6/2005 Yamazaki et al.
2005/0257738 A1* 11/2005 Tateishi et al. ............... 118/300
2007/0285278 A1* 12/2007 Forsstrom ............... 340/870.28

FOREIGN PATENT DOCUMENTS
| JP | 5-41596 A | 2/1993 |
|---|---|---|
| JP | 2001-87693 A | 4/2001 |
| JP | 2001-351519 A | 12/2001 |
| JP | 2002-346452 A | 12/2002 |
| JP | 2003-225606 A | 8/2003 |
| JP | 2004-298775 A | 10/2004 |
| JP | 2005-131621 A | 5/2005 |
| JP | 2005-146768 A | 6/2005 |

OTHER PUBLICATIONS
International Search Report of PCT/JP2006/321481, date of mailing Dec. 26, 2006.

* cited by examiner

*Primary Examiner* — Yewebdar Tadesse
(74) *Attorney, Agent, or Firm* — Westerman, Hattori, Daniels & Adrian, LLP

(57) ABSTRACT

A liquid material application device having high space utilization efficiency and having excellent maintainability. In a liquid material application device for applying a liquid material to a desired position on a surface of a workpiece in a box by relatively moving a nozzle for discharging the liquid material and a table on which the workpiece is placed to face the nozzle, the liquid material application device comprises a carrying in/out opening formed in a side surface of the box and allowing the workpiece to be carried in and carried out therethrough, a beam extending toward the carrying in/out opening, an application head movable in the extending direction of the beam, beam moving means for moving the beam above and in parallel to the table, and a control unit for controlling operations of the aforesaid components.

18 Claims, 10 Drawing Sheets

[Fig.1]
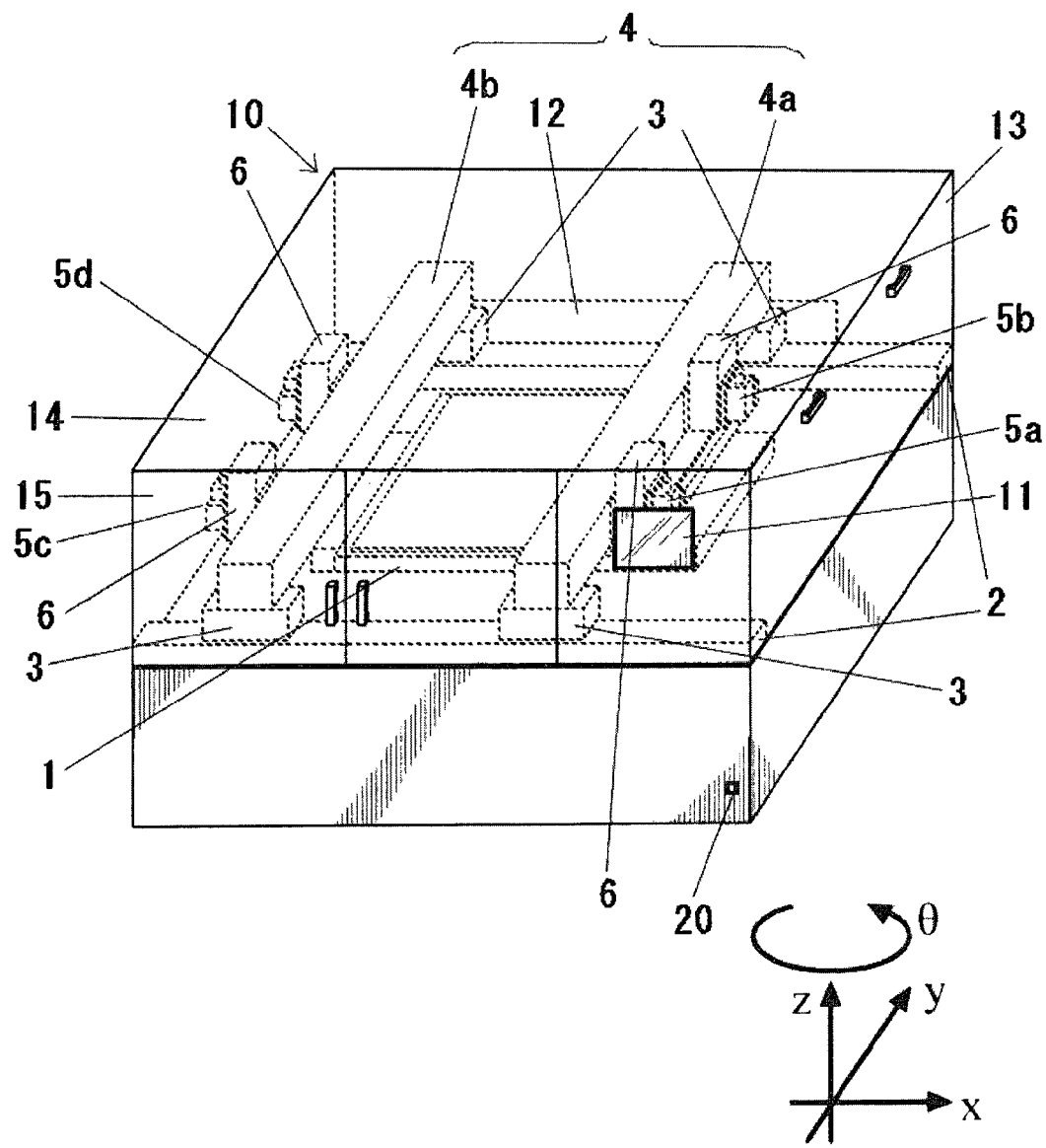

[Fig.2]
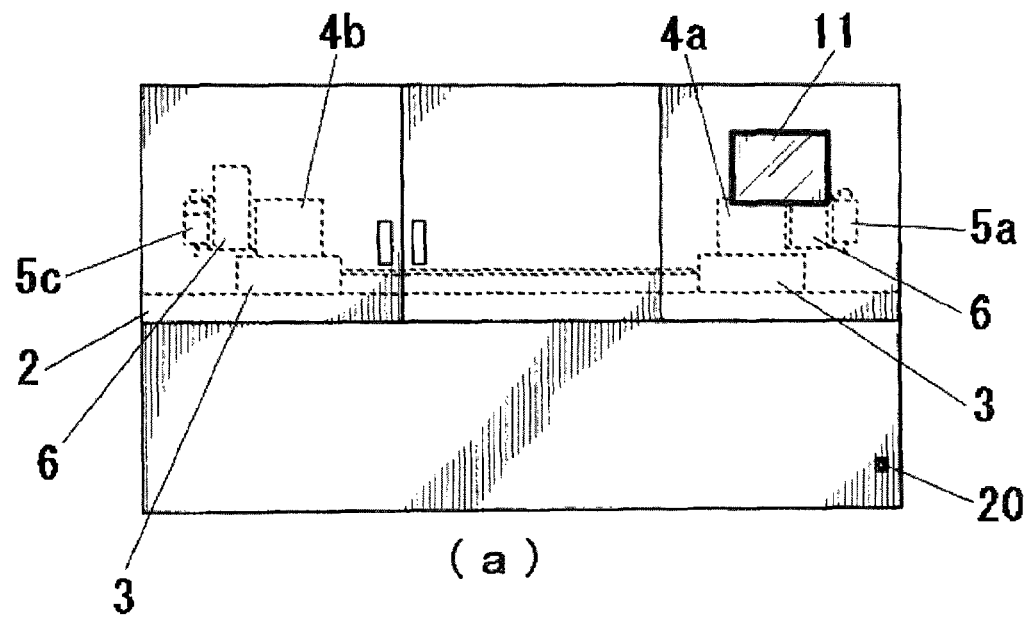
(a)
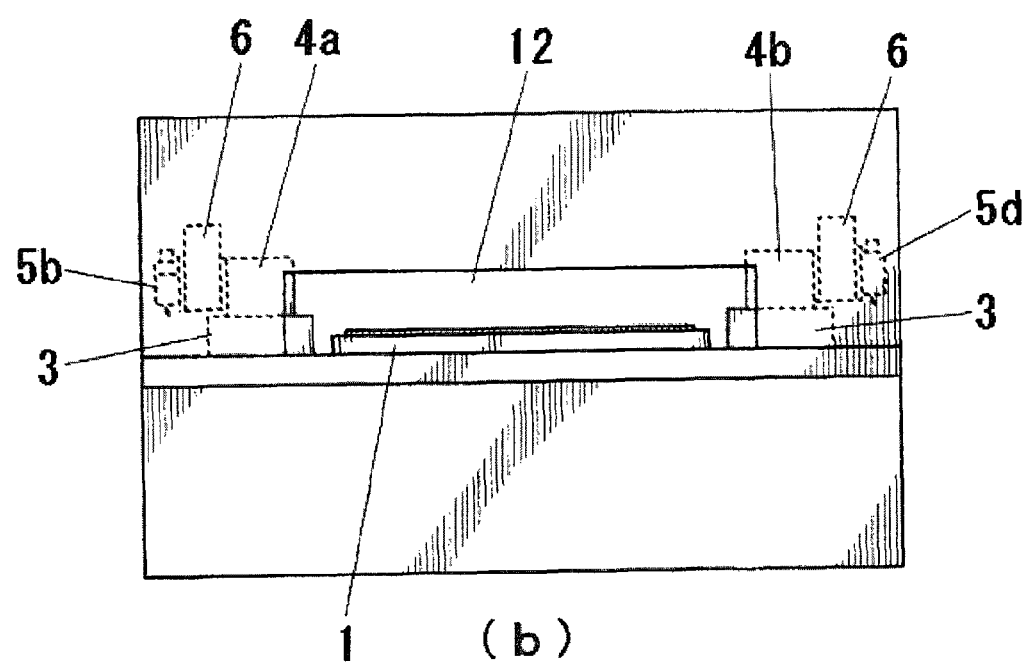
(b)

[Fig.3]
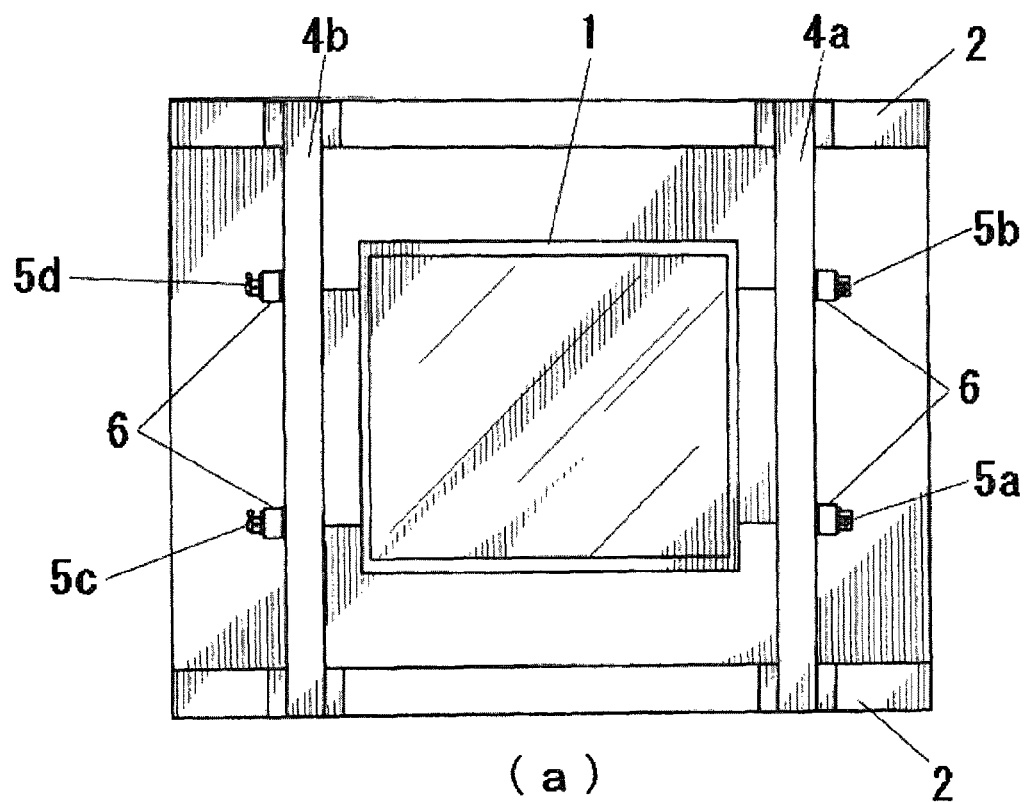
(a)
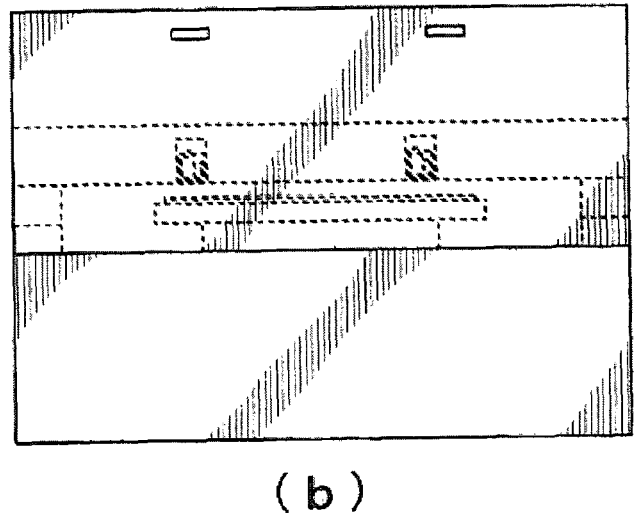
(b)

[Fig.4]
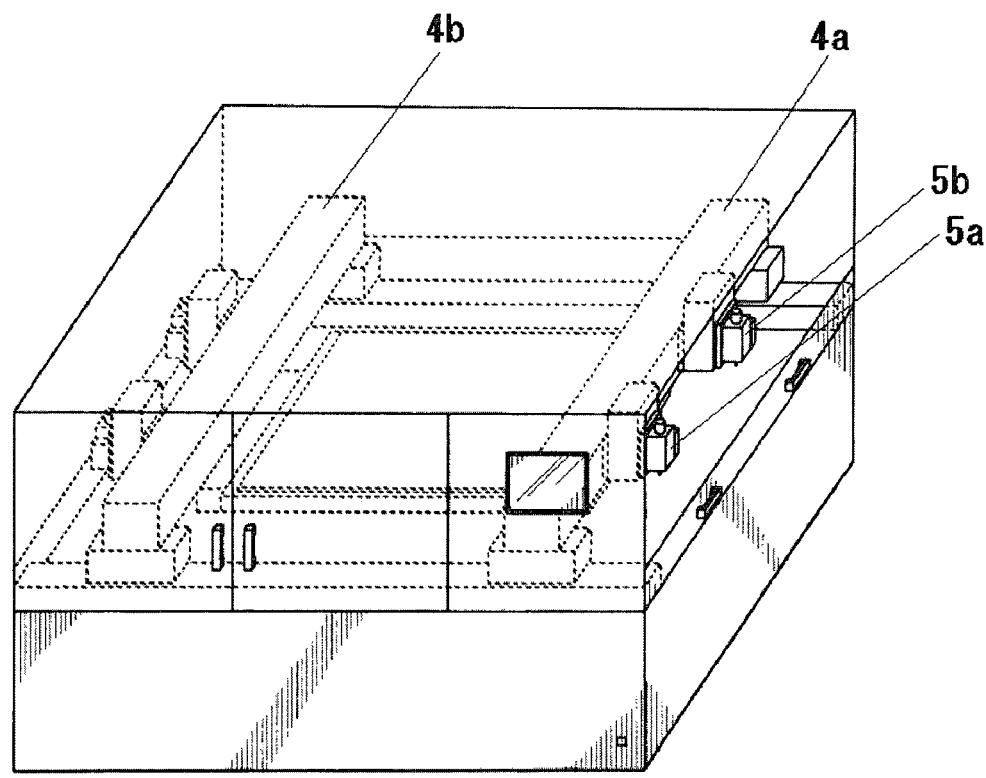
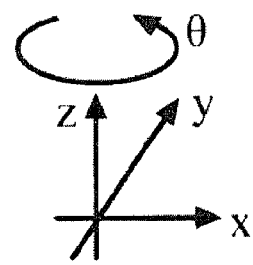

[Fig.5]
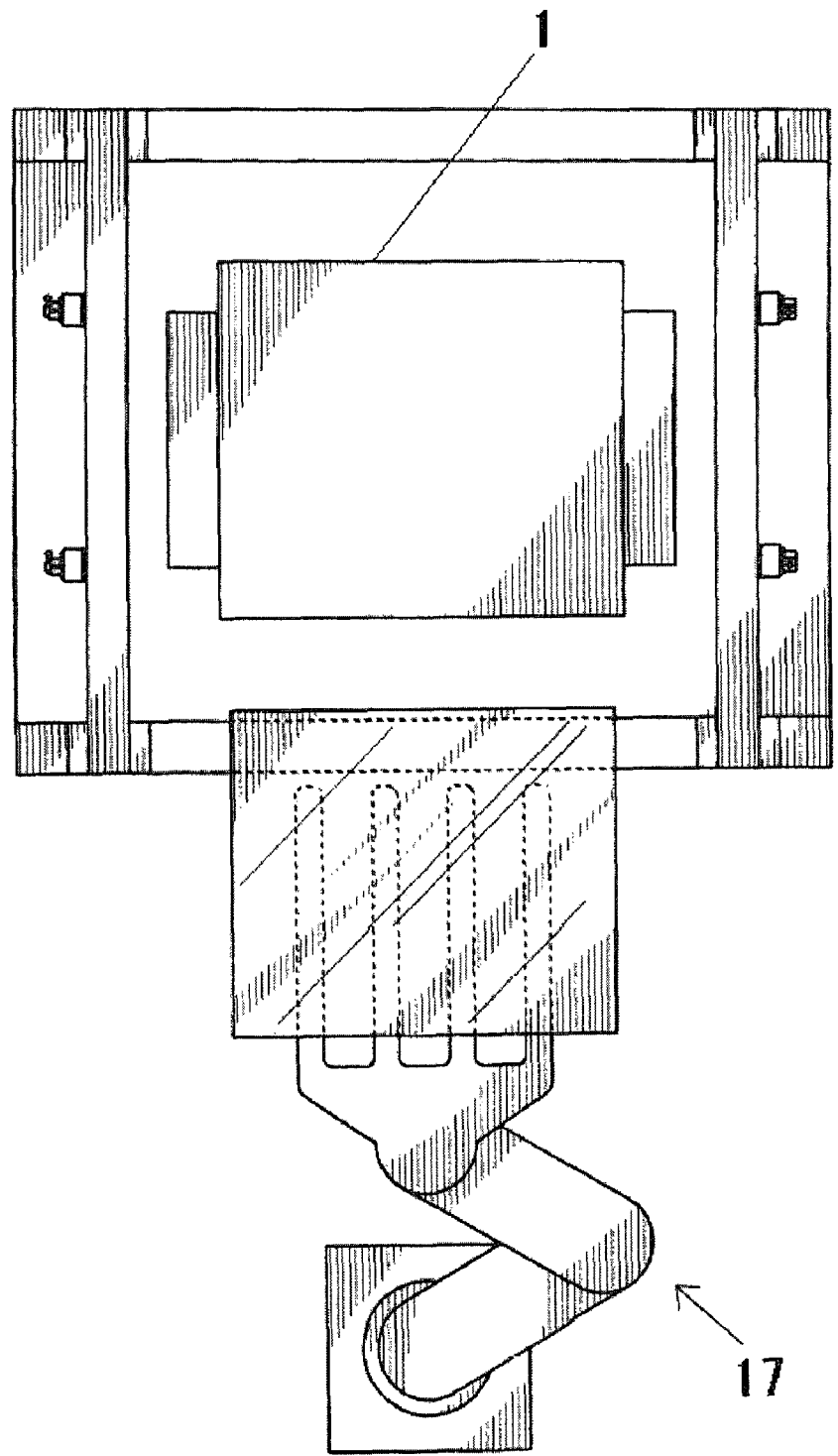

[Fig.6]
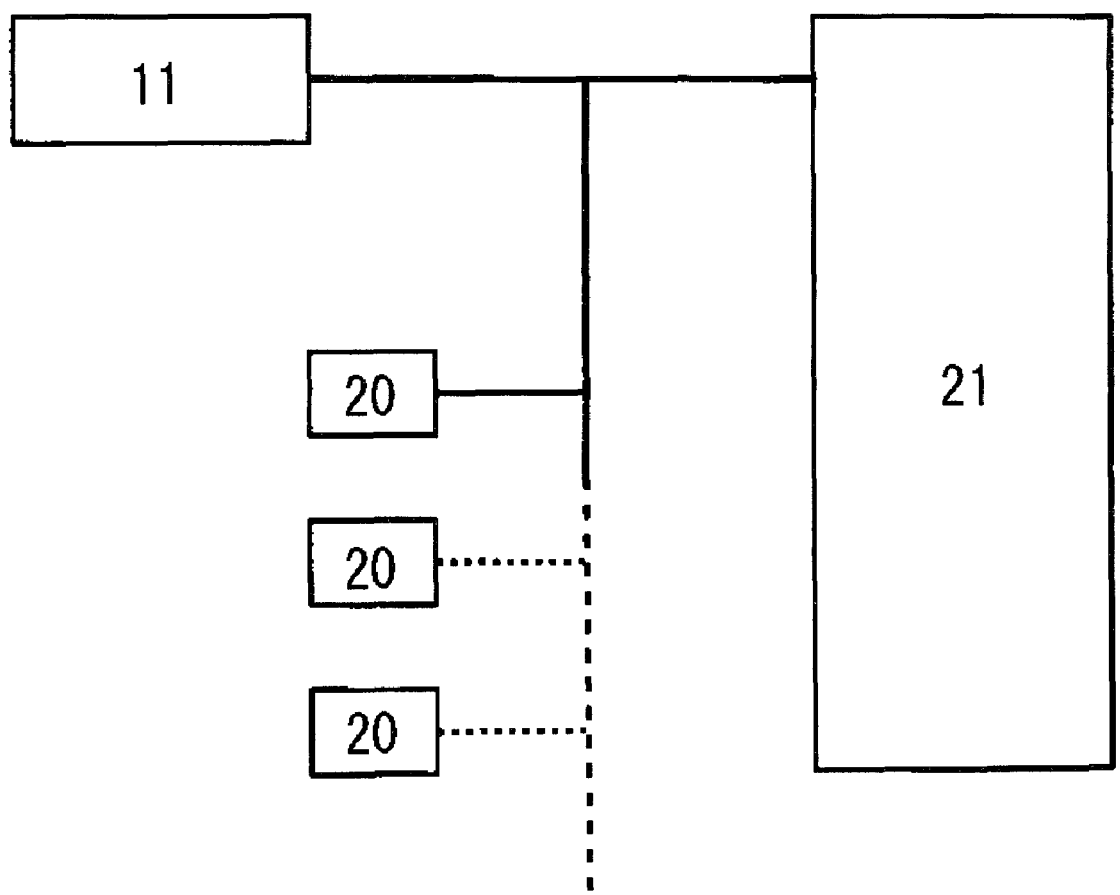

[Fig.7]
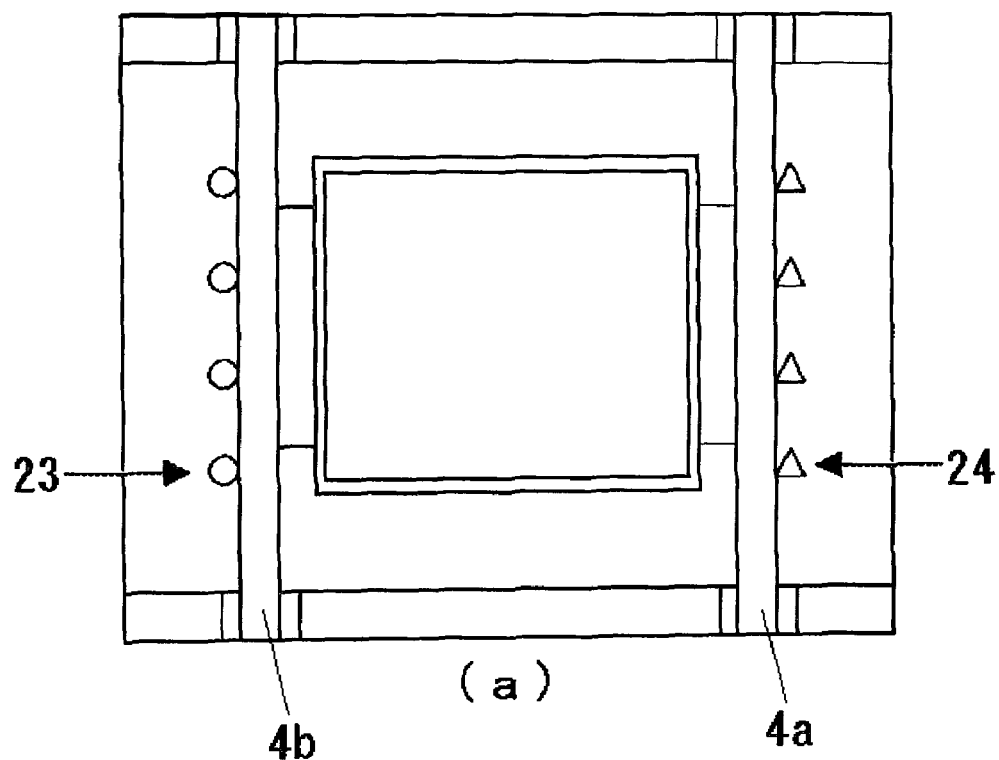
(a)
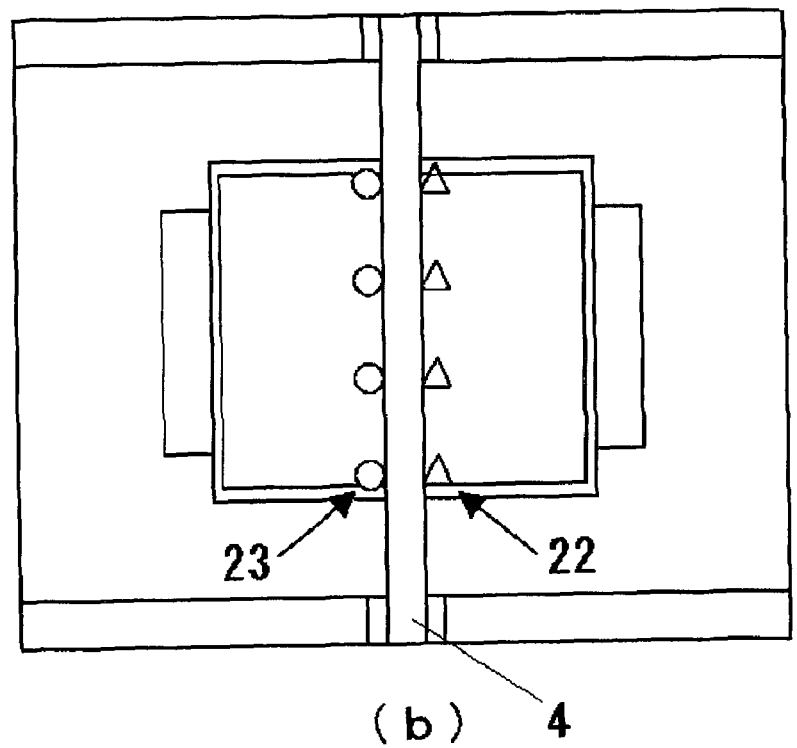
(b)

[Fig.8]
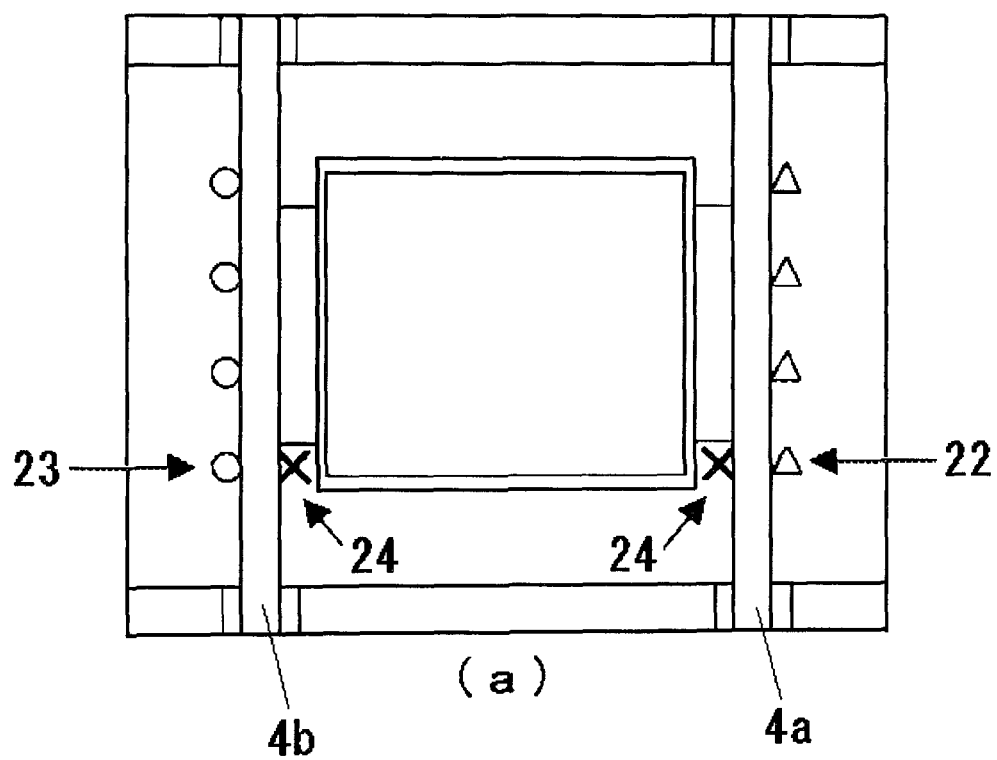
(a)
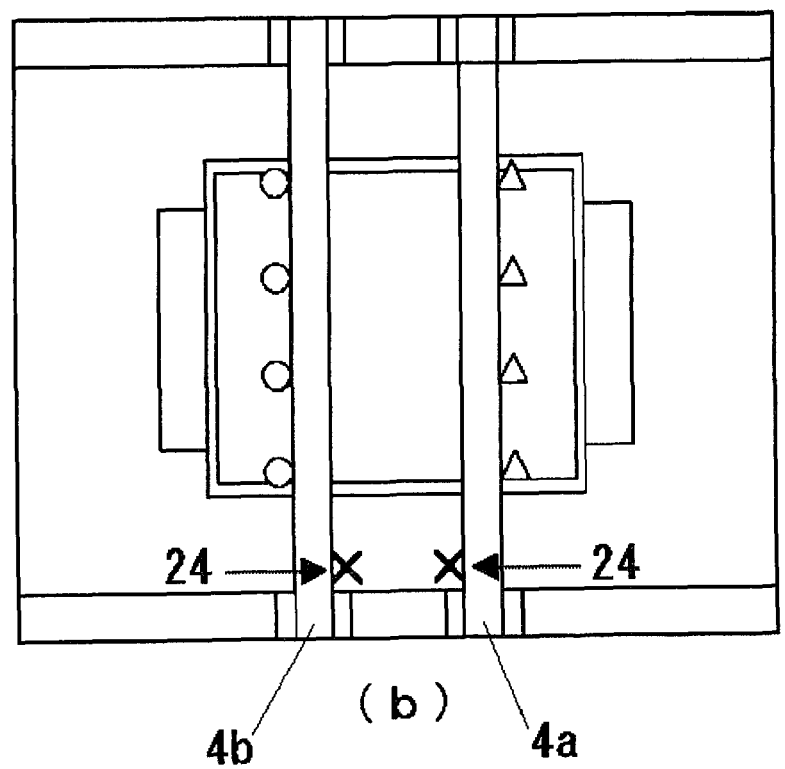
(b)

[Fig.9]
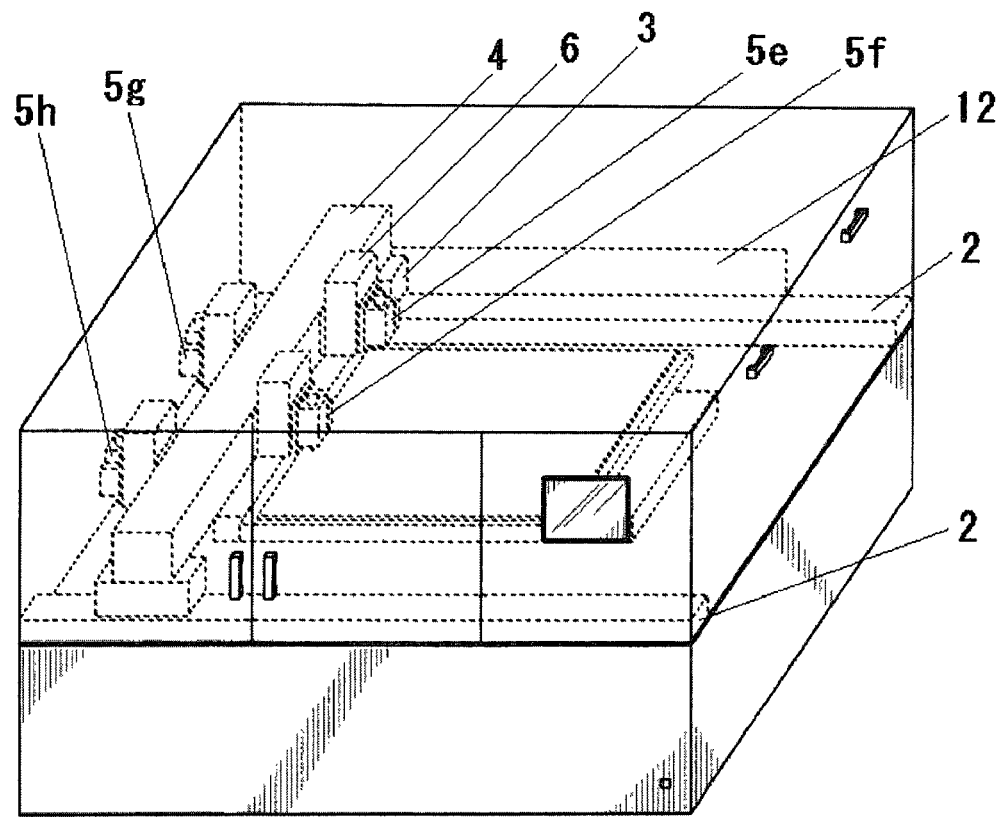

[Fig.10]
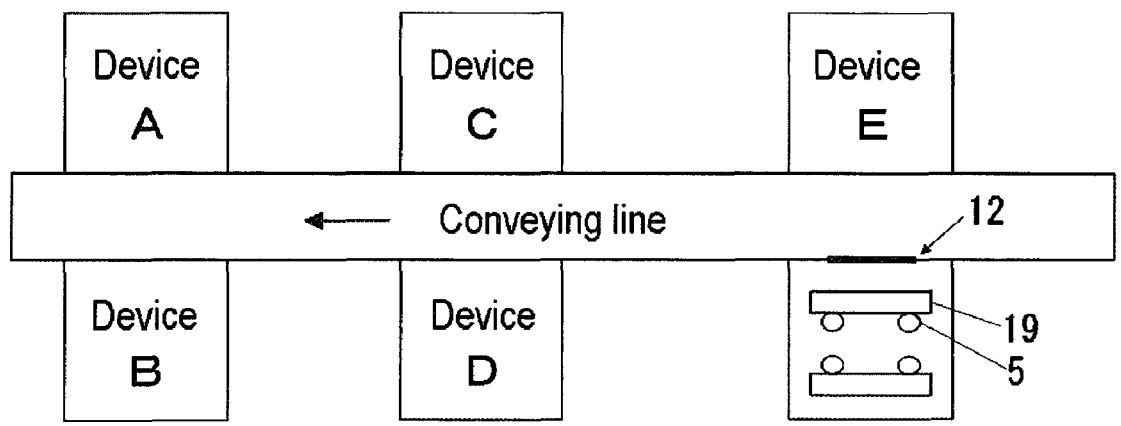

LIQUID MATERIAL APPLICATION DEVICE

TECHNICAL FIELD

The present invention relates to a device for applying and dripping liquid materials ranging from a low viscosity material, such as water and alcohol, to a fluid with high consistency, such an adhesive and a paste- or a cream-like industrial material, to a desired position on a workpiece in a desired shape.

BACKGROUND ART

Recently, with an increase in demands for a larger-sized display, the size of a glass substrate has exceeded 1 m×1 m and the size of an application (coating) apparatus has also increased correspondingly. A liquid material application device mainly used in the past is of the type that a liquid material is applied while a table on which a substrate is placed is moved in the XY-directions to change the relative positional relationship between a nozzle and a table. However, a gate type structure has been more popularly used for the reasons that an increase in weight of the table makes it more difficult to control the table and increases the influence of vibrations during the operation.

As one example of the gate-type liquid material application device, Patent Document 1 discloses a device in which a substrate holding mechanism for holding a substrate formed with a paste pattern is held movable only in one direction, two sets of head support mechanisms each provided with an application head for applying a paste onto the substrate, the application head being supported on the head support mechanism to be movable in a direction perpendicular to the moving direction of the substrate, one of the head support mechanisms is fixed to a mount base, and the other head support mechanism is movable in the moving direction of the substrate. It is also disclosed that the other head support mechanism is constructed to be not movable in the moving direction of the substrate while the paste pattern is being drawn on the substrate.

Further, Patent Document 2 discloses a paste application device for applying and drawing a paste pattern in a desired shape on a substrate placed on a table, wherein the paste application device comprises a frame which is movable in one direction within a plane parallel to a surface of the substrate placed on the table and which is extended in a direction differing from the one direction, a plurality of application heads each including a linear motor movable in the extending direction of the frame and having a paste storage tube and a paste discharge port through which the paste filled in the paste storage tube is discharged, and control means for executing control to move the frame relative to the table within a range in which the paste discharge port is positioned to face the substrate placed on the table, and to discharge the paste from the paste discharge ports of the plurality of application heads while moving the plurality of application heads relative to the frame, the plurality of application heads applying and drawing the paste pattern in the desired shape on the substrate.

Patent Document 1: Japanese Patent Laid-Open No. 2002-346452
Patent Document 2: Japanese Patent Laid-Open No. 2003-225606

DISCLOSURE OF THE INVENTION

Problems to be Solved by the Invention

As shown in FIG. 10, the liquid material application device is arranged laterally of a conveying line, and the workpiece is placed on the table by an automatic conveying machine such as a robot. Herein, in the case of frames 19 being disposed parallel to a carrying in/out opening 12, if the workpiece is placed on the table through the carrying in/out opening 12, all the frames 19 have to be each raised up to a position out of interference with the automatic conveying machine, or the application head 5 has been moved to an end of the frame 19 so as not to interfere with the carrying in/out operation by the automatic conveying machine, when the workpiece is placed on the table through the carrying in/out opening 12.

When raising the frame 19, however, a problem arises in that, in consideration of the size of the automatic conveying machine, the frame 19 must be constructed to be disposed at a position higher than the height necessary for the specific applying operation and to be displaced through a larger distance than the vertical stroke necessary for the applying operation. Further, horizontally moving the application head 5 to the right or left along the frame 19 up to the position out of interference with the automatic conveying machine raises a problem that the application head must be constructed to be displaceable through a larger distance than the horizontal displacement necessary for the applying operation. In addition, as the number of the application heads 5 mounted on the frame 19 increases, a space required for retreating the application heads 5 is enlarged correspondingly, thus leading to a problem that the device size is increased unnecessarily.

Moreover, with a recent tendency toward a larger device size, the problem of maintainability has become more serious. In the construction in which the application head is disposed on the inner side of the opposed frames as in Patent Documents 1 and 2, a worker has to put the upper half of the body (or to enter a box in some cases) for maintenance when the maintenance of the application head is performed. Thus, workability is poor, and particles, such as dust and dirt, and contaminants generated from the human body are disadvantageously brought into the device which requires a clean environment. In addition, there is a possibility that the work table, etc. may be damaged by contact with or fall of a tool, etc. during the maintenance work.

For the purpose of improving workability during the maintenance, one conceivable solution is to enlarge a space within the device. Such a solution, however, causes problems that mechanical strength is reduced and predetermined application accuracy cannot be obtained.

In view of the state of the art described above, an object of the present invention is to provide a liquid material application device having high space utilization efficiency and having excellent maintainability.

Means for Solving the Problems

To solve the above-described problems, a first aspect of the present invention resides in a liquid material application device comprising a box having a carrying in/out opening (12) formed in a side surface of the box and allowing a workpiece to be carried in and carried out therethrough, a beam extending toward the carrying in/out opening (12), an application head (5) movable in the extending direction of the beam, slide bases and sliders movably disposed on the slide bases, beam moving means for moving the beam in a translative manner, a table on which the workpiece is placed to face the application head, and a control unit for controlling operations of the aforesaid components, the application device applying a liquid material to a desired position on a surface of the workpiece in the box by relatively moving the application head and the table, wherein the carrying in/out opening (12) is formed at a position higher than the slide bases, and the beam is movable by the beam moving means to a position out of interference with the workpiece when the workpiece is carried in and carried out.

According to a second aspect of the present invention, in the first aspect of the present invention, the application head (5) is comprised of a discharge device (22) for attaching the liquid material discharged from a nozzle end to the workpiece for application, and/or a droplet flying device (23) for making the liquid material departed from a nozzle end to fly for application to the workpiece surface, and/or an inspection device (24) for inspecting at least one of the height, the width, the cross-sectional area, and defects of a figure drawn in a dot-like or linear shape on the workpiece surface.

According to a third aspect of the present invention, in the first or second aspect of the present invention, the box has opening/closing openings formed in right and left side surfaces adjacent to a side surface of the box, in which the carrying in/out opening (12) is formed, for maintenance of the application head (5), and the beam is movable by the beam moving means to a position near the carrying in/out opening (12).

According to a fourth aspect of the present invention, in the first, second or third aspect of the present invention, the beam is disposed one and the application head (5) is disposed plural on longitudinal right and left side surfaces of the beam.

According to a fifth aspect of the present invention, in the fourth aspect of the present invention, the droplet flying device (23) is disposed on one of the longitudinal side surfaces of the beam, and the discharge device (22) is disposed on the other longitudinal side surface.

According to a sixth aspect of the present invention, in the fourth or fifth aspect of the present invention, the beam includes a plurality of application heads (5) on each of the side surfaces of the beam.

According to a seventh aspect of the present invention, in the third aspect of the present invention, the box has opening/closing openings formed in right and left side surfaces adjacent to a side surface of the box, in which the carrying in/out opening (12) is formed, and the beam comprises a first beam and a second beam which are disposed parallel to each other, and the application heads (5) are disposed on respective longitudinal side surfaces of the first and second beams which are positioned closer to the carrying in/out opening.

According to an eighth aspect of the present invention, in the seventh aspect of the present invention, the droplet flying device (23) is disposed on one of the first and second beams, and the discharge device (22) is disposed on the other beam.

According to a ninth aspect of the present invention, in the seventh or eighth aspect of the present invention, the beam includes a plurality of application heads (5) disposed on the same side surface thereof.

According to a tenth aspect of the present invention, in the seventh, eighth or ninth aspect of the present invention, wherein each of the first and second beams includes one inspection device (24) disposed on an inner side surface thereof.

According to an eleventh aspect of the present invention, in any one of the seventh to tenth aspects of the present invention, the first and second beams are each movable by the beam moving means.

According to a twelfth aspect of the present invention, in any one of the first to eleventh aspects of the present invention, the beam moving means comprises a pair of slide bases disposed parallel to each other with a work table interposed therebetween, and sliders movably disposed on the slide bases and supporting the beam.

According to a thirteenth aspect of the present invention, in the first to twelfth aspects of the present invention, a control panel is detachably disposed on the box, and the control unit can be operated from the detached control panel via a wireless network.

According to a fourteenth aspect of the present invention, in the first to thirteenth aspects of the present invention, a communication socket is disposed on the box, and the control unit can be operated from an external terminal via a wired and/or wireless network.

Effect of the Invention

According to the present invention, since the liquid material application device has the above-described constructions, a compact device can be obtained by effectively utilizing a space within the device.

Further, since the liquid material application device has the above-described constructions, maintainability of the device can be improved and intrusion of dirt and dust can be cut during the maintenance work, whereby a cleaner environment can be held.

BRIEF DESCRIPTION OF THE DRAWINGS

FIG. 1 is an external appearance perspective view of an application device according to Embodiment 1.

FIG. 2 illustrates application device according to Embodiment 1; specifically FIG. 2(a) is a front view and FIG. 2(b) is a rear view.

FIG. 3 illustrates application device according to Embodiment 1; specifically FIG. 3(a) is a plan view showing the interior as viewed from above, and FIG. 3(b) is a side view.

FIG. 4 is an external appearance perspective view of the application device according to Embodiment 1 with a right side panel opened.

FIG. 5 is a schematic plan view for explaining conveyance of a work by a workpiece conveying machine.

FIG. 6 is a block diagram of a main control unit for the application device according to Embodiment 1.

FIG. 7 illustrates application heads; specifically FIG. 7(a) is a plan view for explaining an example of construction using a single beam, and FIG. 7(b) is a plan view for explaining an example of construction using plural beams.

FIG. 8 is a plan view for explaining beam positions during maintenance in the case of plural beams.

FIG. 9 is an external appearance perspective view of a liquid material application device according to Embodiment 2.

FIG. 10 is a plan view for explaining one example of layout of a known liquid material application device.

DESCRIPTION OF REFERENCE CHARACTERS 1 table
2 X-axis slide base
3 X-axis slider
4 beam (Y-axis slide base)
5 application head
6 Y-axis slider
10 box
11 control panel
12 carrying in/out opening
13 right side panel
14 left side panel
15 front panel
17 workpiece conveying machine 19 frame
20 communication socket
21 main control unit
22 discharge device
23 droplet flying device
24 inspection device

BEST MODE FOR CARRYING OUT THE INVENTION

The best mode for carrying out the present invention will be described below in connection with embodiments, but the present invention is in no way restricted by the following embodiments.

Embodiment 1

<<Construction>>

As shown in FIGS. 1-3, a liquid material application device of this embodiment includes, within a square box 10, a table 1 on which a workpiece is placed, a pair of X-axis slide bases 2 installed on both sides of the table 1 and extending parallel to the X-axis direction, and beams 4 (Y-axis slide bases 4a, 4b) supported on X-axis sliders 3 and extending in the Y-direction.

The table 1 includes θ-rotation means for moving the workpiece in the direction around a θ-axis to be positioned at a predetermined angle. The table 1 may be directly supported by the θ-rotation means disposed under the table 1, or may be mounted on moving means, which is movable in the X- or Y-axis direction, so as to assist a relative moving operation performed by the X-/Y-axis sliders.

On each of the pair of X-slide bases 2, two X-axis sliders 3 are disposed to be movable in the lengthwise direction of the X-axis slide base 2. Four X-axis sliders 3 support opposite ends of two beams 4 such that when the X-axis sliders 3 slide over the X-axis slide bases 2, the beams 4 can be moved in the X-direction above the table 1.

The X-axis slide bases 2 are disposed at an interval sufficiently wider than a carrying in/out opening 12 to such an extent as not closing the carrying in/out opening 12 when each beam 4 is located at its end position. With such an arrangement, the beams 4 and application heads 5 are avoided from interfering with the workpiece when it is carried in.

The beams 4 are comprised of a pair of Y-axis slide bases 4a and 4b. Two Y-axis sliders 6 are disposed on outer side surfaces of each of the paired Y-axis slide bases 4a and 4b, and the application head 5 for discharging a liquid material is disposed on each Y-axis slider 6 to be movable in the Z-direction.

For example, each of the X- and Y-axis slide bases includes a linear motor magnet and a directly-operating guide, and each slider includes a linear motor. However, the combination of the slide base and slider is not limited to the above-described construction. As another example, the slide base may include a motor and a ball screw rotating in conjunction with the motor, and the slider may include a nut that is moved straightforward in conjunction with the rotation of the ball screw.

The box 10 provides an enclosed space for preventing adhesion of dirt and dust to a substrate. The box 10 has the carrying in/out opening 12 formed in its rear panel to allow carrying in/out of the workpiece therethrough. Further, the box 10 has grips disposed on its right and left side panels for sliding the box 10 when maintenance is performed, and grips for a double-leafed hinged door which are formed on its front panel 15. A control panel 11 for operating a main control unit 21 (not shown in FIGS. 1-3) is disposed on the front panel 15 of the box 10.

Inside the box 10, clean air is always caused to flow from above toward below so that unnecessary materials, such as dust, will not remain and an applying operation can be performed in a clean environment. To that end, an air cleaner may be additionally used in a combined manner.

The box 10 is preferably constructed, for example, of a metal frame of SUS, aluminum, or the like and walls made a metal or a transparent resin. The resin-made walls can be formed to be clear (colorless and transparent), yellow, dark brown, red, dark gray, or smoke (gray). Optimum color can be selectively employed depending on the actual application of the liquid material used (including, e.g., the case where the liquid material is apt to be easily damaged by ultraviolet rays).

A communication socket 20 is disposed in a lower portion of the box 10 such that the device can be remotely operated by connecting the communication socket 20 to an external terminal, e.g., a PC, via a network cable. Although the device can be operated from the control panel 11 disposed on the box 10, the remote operation is effective when the maintenance work is performed with the front or side panel being opened, because it is difficult to operate the control panel 11 in such a condition. Preferably, the control panel 11 is attached to the box 10 in a detachable manner, and when the control panel 11 is detached from the box 11, the remote operation can be performed via communication means such as a wireless LAN.

As shown in FIG. 6, because the communication socket 20 is electrically connected to the main control unit 21, the main control unit 21 can be operated without intervention of the control panel 11, and hence the maintenance work for the device can be more smoothly performed online. The installed position of the communication socket 20 is not limited to the front side of the device, and a plurality of communication sockets may be installed on the right and left side surfaces. The remote operation can also be performed by connecting a portable dedicated terminal to a network, or performed via radio by mounting communication means, such as a wireless LAN.

<<Operation>>

When carrying in the workpiece, the main control unit 21 moves the X-axis sliders 3 to move the right-side beam 4a to a right end of each X-axis slide base 2 and to move the left-side beam 4b to a left end of each X-axis slide base 2 such that the beams 4 do not overlap with the table 1. After the movements of the beams 4 have been completed, the workpiece is carried in through the carrying in/out opening 12 by a workpiece conveying machine 17 (see FIG. 5). After placing the workpiece on the table 1, the main control unit 21 moves the X-axis sliders 3 and the Y-axis sliders 6 to arrange the application heads 5 corresponding to desired positions on the workpiece. Then, each application head 5 is descended by Z-axis moving means provided on the application head 5, thus applying the liquid material to the workpiece. At that time, the applied liquid material can be drawn in a desired shape by moving the X-axis sliders 3 and the Y-axis sliders 6 as required.

After the end of the applying operation, the main control unit 21 moves the X-axis sliders 3 to move the right-side beam 4a to the right end of each X-axis slide base 2 and to move the left-side beam 4b to the left end of each X-axis slide base 2 such that the beams 4 do not overlap with the table 1. After the movements of the beams 4 have been completed, the workpiece is carried out through the carrying in/out opening 12 by the workpiece conveying machine 17 (see FIG. 5).

While a fork type conveying machine is illustrated in FIG. 5, it is needless to say that a similar effect can also be obtained with an air type conveying machine.

<<Maintenance>>

The maintenance work for the application heads 5 is performed by moving both or one of the beams 4a and 4b to the right end and/or the left end and by opening the right and/or left side surface of the box 10.

When performing the maintenance of application heads 5a and 5b disposed on the right-side beam 4a, the X-axis sliders 3 are moved to move the right-side beam 4a to the right end of each X-axis slide base 2, and the right side panel 13 is slid downwards to open the right side surface of the device, followed by performing the required maintenance work (see FIG. 4). At that time, the right-side beam 4a is located at the right end of each X-axis slide base 2, and the application heads 5a and 5b are positioned within a range easily reachable from the opened right side surface of the device. Therefore, the maintenance work, such as replacement of consumable supplies, can be easily performed.

Similarly, when performing the maintenance of application heads 5c and 5d disposed on the left-side beam 4b, the X-axis sliders 3 are moved to move the left-side beam 4b to the left end of each X-axis slide base 2, and the left side panel 14 is slid downwards to open the left side surface of the device, followed by performing the required maintenance work. At that time, the left-side beam 4b is located at the left end of each X-axis slide base 2, and the application heads 5c and 5d are positioned within a range easily reachable from the opened left side surface of the device. Therefore, the maintenance work, such as replacement of consumable supplies, can be easily performed.

The construction for making the right and left side panels open is not limited to a slide door, and a double-leafed hinged door, for example, may be disposed instead.

In the device of this embodiment, as described above, the operations of the beams 4 in the maintenance are the same as those in the carrying in of the workpiece. Accordingly, while the beams 4 are positioned to the opposite ends of the slide bases 2 when the workpiece is carried in, simple maintenance work can be performed without stopping the online operation by opening the right side panel 13 or the left side panel 14. In the case of a device operated in-line, for example, simple maintenance work, such as fine adjustment of the application heads 5 and filling of the liquid material by replacement of a syringe, can be performed without stopping the line. Hence, productivity can be greatly increased.

Further, since the beams 4 function as protective covers for the operator when the workpiece is carried in, safety of the operator can be ensured.

In this embodiment, each of the application heads 5 disposed on the beams 4 can be comprised of a discharge device 22 for pressurizing the liquid material stored in a reservoir with air pressure such that the liquid material discharged from a nozzle end is attached to the workpiece for application, a droplet flying device 23 for abruptly stopping movement of a plunger disposed above the liquid material stored in a reservoir and sliding in close contact with an inner wall surface of the reservoir, whereby the liquid material is departed from the nozzle end and is applied to the workpiece surface, and an inspection device 24 for inspecting at least one of the height, the width, the cross-sectional area, and defects in a dot-like or linear shape drawn on the workpiece surface, etc.

For example, as shown in FIG. 7a, the application heads 5 can be constructed by different devices per beam by arranging the discharge devices 22 on the right side surface of the beam 4a disposed on the right side and the droplet flying devices 23 on the left side surface of the beam 4b disposed on the left side.

The arrangement can be modified such that moving means, e.g., sliders, are disposed on mutually facing surfaces (inner surfaces) of the beams 4a and 4b, i.e., on the left side surface of the right-side beam 4a and the right side surface of the left-side beam 4b, and one application head 5 is additionally disposed on each of the sliders (see FIG. 8a). Even with the application head 5 disposed on the inner surface of the beam, if one application head is arranged on the beam close to the front panel, its maintenance can be performed by opening the double-leafed hinged door in the front panel and maintainability is not impaired (see FIG. 8b). In a preferred arrangement disclosed herein, a plurality of discharge devices 22 are disposed on the right side surface of the beam 4a and one inspection device 24 for the discharge devices is disposed on the left side surface thereof, whereas a plurality of droplet flying devices 23 are disposed on the left side surface of the beam 4b and one inspection device 24 for the droplet flying devices is disposed on the right side surface thereof. The reason is that it is general to check the line width, the line height, the cross-sectional area, the dot diameter, the dot height, defects, breaks, etc. by using one inspection device 24, and that a sufficient effect is expected even with the arrangement including one inspection device 24 on the inner surface of each beam 4. The provision of the inspection device 24 makes it possible to perform inspection by moving the beam 4 after a series of applying and drawing operations, or immediately after one cycle of applying and drawing operation.

Embodiment 2

In a device of this embodiment, as shown in FIG. 9, one beam 4 is employed and the application heads 5 are disposed on both right and left side surfaces of the beam 4.

<<Operation>>

When carrying in the workpiece, the main control unit 21 moves the X-axis sliders 3 to move the beam 4 to the right end or the left end of each X-axis slide base 2 such that the beam 4 does not overlap with the table 1. After the movement of the beam 4 has been completed, the workpiece is carried in through the carrying in/out opening 12 by the workpiece conveying machine 17. After placing the workpiece on the table 1, the main control unit 21 moves the X-axis sliders 3 and the Y-axis sliders 6 to arrange the application heads 5 corresponding to desired positions on the workpiece. Then, each application head 5 is descended by Z-axis moving means provided on the application head 5, thus applying the liquid material to the workpiece. At that time, the applied liquid material can be drawn in a desired shape by moving the X-axis sliders 3 and the Y-axis sliders 6 as required.

After the end of the applying operation, the main control unit 21 moves the X-axis sliders 3 to move the beam 4 to the right end or the left end of each X-axis slide base 2 such that the beam 4 does not overlap with the table 1. After the movement of the beam 4 has been completed, the workpiece is carried out through the carrying in/out opening 12 by the workpiece conveying machine 17.

<<Maintenance>>

The maintenance work for the application heads 5 is performed by moving the beam 4 to the right end or the left end and by opening the right or left side surface of the box 10.

When performing the maintenance of application heads 5e and 5f disposed on the right side surface of the beam, the X-axis sliders 3 are moved to move the beam 4 to the right end of each X-axis slide base 2, and the right side panel 13 is slid downwards to open the right side surface of the device, followed by performing the required maintenance work. At that time, the right-side beam 4 is located at the right end of each X-axis slide base 2, and the application heads 5e and 5f are positioned within a range easily reachable from the opened right side surface of the device. Therefore, the maintenance work, such as replacement of consumable supplies, can be easily performed.

Similarly, when performing the maintenance of application heads 5g and 5h disposed on the left-side surface of the beam 4, the X-axis sliders 3 are moved to move the beam 4 to the left end of each X-axis slide base 2, and the left side panel 14 is slid downwards to open the left side surface of the device, followed by performing the required maintenance work. At that time, the beam 4 is located at the left end of each X-axis slide base 2, and the application heads 5g and 5h are positioned within a range easily reachable from the opened left side surface of the device. Therefore, the maintenance work, such as replacement of consumable supplies, can be easily performed.

Thus, the operation of the beam 4 in the carrying in of the workpiece and the operation of the beam 4 in the maintenance are common in point of moving the beam 4 to the right or left end of each X-axis slide base 2. Accordingly, simple maintenance work can be performed by, when the workpiece is carried in, positioning the beam 4 at the right or left end of each slide base 2 corresponding to the position of the application head which requires maintenance, and by opening the right side panel 13 or the left side panel 14 during a standby state for conveyance of the workpiece.

In the case of a device operated in-line, a remarkable effect can be obtained as with Embodiment 1 in that, for example, simple maintenance work, such as fine adjustment of the application heads 5 and filling of the liquid material by replacement of a syringe, can be performed without stopping the line, and hence productivity can be increased.

Also in the device of this embodiment, each of the application heads 5 disposed on the beam 4 can be comprised of the discharge device 22, the droplet flying device 23, and the inspection device 24, etc.

For example, as shown in FIG. 7b, the application heads 5 can be constructed by different devices by arranging the discharge devices 22 on the right side surface of the beam 4 and the droplet flying devices 23 on the left side surface of the beam 4.

Further, the inspection device 24 may be disposed at the position of one of the discharge devices 22 and the droplet flying devices 23.

INDUSTRIAL APPLICABILITY

Although the present invention can be employed in a wide range of fields, the present invention is particularly applicable to a workpiece in the form of a flat plate, and the effect of the present invention becomes more significant as the size of the workpiece increases. For example, the present invention can be utilized in a flat panel display production process. In particular, the present invention can be applied to workpieces in the liquid display panel production process and the plasma display production process.

The invention claimed is:

1. A liquid material application device comprising
   a box having a carrying in/out opening formed in a side surface of the box and allowing a workpiece to be carried in and carried out therethrough,
   a beam extending toward the carrying in/out opening,
   an application head movable in the extending direction of the beam,
   beam moving mechanism for moving the beam in a translative manner comprising slide bases and beam supporting sliders movably disposed on the slide bases,
   a table on which the workpiece is placed to face the application head, and
   a control unit for controlling operations of the aforesaid components,
   the application device for applying a liquid material to a desired position on a surface of the workpiece in the box by relatively moving the application head and the table,
   wherein the carrying in/out opening is formed at a position higher than the slide bases, and
   the beam is movable by the beam moving mechanism to a position out of interference with the workpiece when the workpiece is carried in and carried out.

2. The liquid material application device according to claim 1, wherein the application head is comprised of a discharge device for attaching the liquid material discharged from a nozzle end to the workpiece for application, and/or a droplet flying device for making the liquid material departed from a nozzle end to fly for application to the workpiece surface, and/or an inspection device for inspecting at least one of the height, the width, the cross-sectional area, and defects of a figure drawn in a dot-like or linear shape on the workpiece surface.

3. The liquid material application device according to claim 1, wherein the box has opening/closing openings, formed in right and left side surfaces adjacent to a side surface in which the carrying in/out opening is formed, for maintenance of the application head, and
   the beam is movable by the beam moving mechanism to a position near the opening/closing openings.

4. The liquid material application device according to claim 3, wherein the box has opening/closing openings formed in right and left side surfaces adjacent to a side surface of the box, in which the carrying in/out opening is formed, and
   the beam comprises a first beam and a second beam which are disposed parallel to each other, and the application heads are disposed on respective longitudinal side surfaces of the first and second beams which are positioned closer to the opening/closing openings.

5. The liquid material application device according to claim 4, wherein the droplet flying device is disposed on one of the first and second beams, and the discharge device is disposed on the other beam.

6. The liquid material application device according to claim 4, wherein the beam includes a plurality of application heads disposed on the same side surface thereof.

7. The liquid material application device according to claim 4, wherein each of the first and second beams includes one inspection device disposed on an inner side surface thereof.

8. The liquid material application device according to claim 4, wherein the first and second beams are each movable by the beam moving mechanism.

9. The liquid material application device according to claim 4, wherein the application head is comprised of a discharge device for attaching the liquid material discharged from a nozzle end to the workpiece for application, and/or a droplet flying device for making the liquid material departed from a nozzle end to fly for application to the workpiece surface, and/or an inspection device for inspecting at least one of the height, the width, the cross-sectional area, and defects of a figure drawn in a dot-like or linear shape on the workpiece surface.

10. The liquid material application device according to claim 4, wherein the slide bases comprises a pair of slide bases disposed parallel to each other with a work table interposed therebetween.

11. The liquid material application device according to claim 1, wherein the beam is disposed one and the application head is disposed plural on longitudinal right and left side surfaces of the beam.

12. The liquid material application device according to claim 11, wherein the droplet flying device is disposed on one of the longitudinal side surfaces of the beam, and the discharge device is disposed on the other longitudinal side surface.

13. The liquid material application device according to claim 11, wherein the beam includes a plurality of application heads on each of the side surfaces of the beam.

14. The liquid material application device according to claim 11, wherein the application head is comprised of a discharge device for attaching the liquid material discharged from a nozzle end to the workpiece for application, and/or a droplet flying device for making the liquid material departed from a nozzle end to fly for application to the workpiece surface, and/or an inspection device for inspecting at least one of the height, the width, the cross-sectional area, and defects of a figure drawn in a dot-like or linear shape on the workpiece surface.

15. The liquid material application device according to claim 11, wherein the slide bases comprises a pair of slide bases disposed parallel to each other with a work table interposed therebetween.

16. The liquid material application device according to claim 1, wherein the slide bases comprises a pair of slide bases disposed parallel to each other with a work table interposed therebetween.

17. The liquid material application device according to claim 1, wherein a control panel is detachably disposed on the box, and the control unit can be operated from the detached control panel via a wireless network.

18. The liquid material application device according to claim 1, wherein a communication socket is disposed on the box, and the control unit can be operated from an external terminal via a wired and/or wireless network.

* * * * *